(12) United States Patent
Chang et al.

(10) Patent No.: US 10,636,872 B1
(45) Date of Patent: Apr. 28, 2020

(54) APPARATUS AND METHOD TO PREVENT INTEGRATED CIRCUIT FROM ENTERING LATCH-UP MODE

(71) Applicant: GLOBALFOUNDRIES INC., Grand Cayman (KY)

(72) Inventors: Shunhua T. Chang, South Burlington, VT (US); Ephrem G. Gebreselasie, South Burlington, VT (US); Mujahid Muhammad, Essex Junction, VT (US); Xiangxiang Lu, Essex Junction, VT (US); Mickey H. Yu, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/176,380

(22) Filed: Oct. 31, 2018

(51) Int. Cl.
| | |
|---|---|
| *H01L 29/06* | (2006.01) |
| *H01L 29/10* | (2006.01) |
| *H01L 27/06* | (2006.01) |
| *H01L 29/872* | (2006.01) |
| *H01L 23/528* | (2006.01) |
| *G09G 3/32* | (2016.01) |

(52) U.S. Cl.
CPC ........ *H01L 29/0684* (2013.01); *H01L 23/528* (2013.01); *H01L 27/0629* (2013.01); *H01L 29/0649* (2013.01); *H01L 29/1095* (2013.01); *H01L 29/872* (2013.01); *G09G 3/32* (2013.01); *G09G 2330/04* (2013.01)

(58) Field of Classification Search
CPC ............. H01L 29/0684; H01L 29/0649; H01L 29/1095; H01L 29/872; H01L 27/0629
See application file for complete search history.

(56) References Cited

U.S. PATENT DOCUMENTS

| | | | |
|---|---|---|---|
| 4,619,033 A | 10/1986 | Jastrzebski | |
| 4,762,802 A | 8/1988 | Parrillo | |
| 4,922,317 A | 5/1990 | Mihara | |
| 5,422,507 A * | 6/1995 | Wanlass | H01L 27/0218 257/355 |
| 5,966,041 A * | 10/1999 | Moane | H03K 19/003 326/80 |
| 6,054,344 A | 4/2000 | Liang et al. | |
| 6,404,269 B1 * | 6/2002 | Voldman | H01L 27/0255 327/534 |
| 6,989,979 B1 | 1/2006 | Tong et al. | |
| 7,773,442 B2 | 8/2010 | Kapre et al. | |
| 9,054,517 B1 * | 6/2015 | Zhu | H02H 9/04 |
| 9,502,586 B1 * | 11/2016 | Kim | H01L 29/66181 |

(Continued)

*Primary Examiner* — Nathan W Ha
(74) *Attorney, Agent, or Firm* — David Cain; Hoffman Warnick LLC (57) ABSTRACT

The disclosure provides an apparatus for preventing an integrated circuit (IC) structure from entering a latch-up mode. In an embodiment, the apparatus may include: a p-type substrate; an n-well within the p-type substrate; an n-type region within the p-type substrate, the n-type region being distinct from the n-well; a p-type region within the n-well; a power supply electrically coupled to the p-type region within the n-well; and a directional diode electrically coupling the power supply to the n-well in parallel with the p-type region. The directional diode biases a current flow from the power supply to the n-well, and the directional diode contacts the n-well distal to the p-type region.

20 Claims, 9 Drawing Sheets

(56) References Cited

U.S. PATENT DOCUMENTS

| | | | |
|---|---|---|---|
| 2002/0030469 A1* | 3/2002 | Yunosawa | E05B 77/12 320/166 |
| 2003/0193765 A1* | 10/2003 | Kitano | H01L 27/0255 361/56 |
| 2005/0024908 A1* | 2/2005 | Gizara | H02M 3/00 363/147 |
| 2006/0028776 A1* | 2/2006 | Stockinger | H01L 27/0255 361/56 |
| 2006/0091875 A1* | 5/2006 | Kimura | G05F 3/30 323/315 |
| 2006/0152868 A1* | 7/2006 | Ker | H01L 27/0259 361/56 |
| 2007/0194403 A1 | 8/2007 | Cannon et al. | |
| 2012/0075757 A1* | 3/2012 | Chen | H01L 27/0285 361/56 |
| 2013/0127524 A1* | 5/2013 | Yamaji | H01L 21/761 327/537 |
| 2014/0029152 A1* | 1/2014 | Mazzola | H03K 17/6871 361/115 |
| 2014/0240883 A1 | 8/2014 | Fan et al. | |
| 2014/0339608 A1* | 11/2014 | Rountree | H01L 27/0266 257/268 |
| 2015/0109706 A1* | 4/2015 | Iwamizu | H02H 9/025 361/84 |
| 2015/0256166 A1* | 9/2015 | Saito | H03K 5/1532 327/58 |
| 2016/0035906 A1* | 2/2016 | Lee | H01L 29/8611 257/212 |
| 2016/0056142 A1* | 2/2016 | Kaida | H01L 27/0255 257/655 |
| 2016/0056282 A1* | 2/2016 | Yamaji | H03K 17/002 257/337 |
| 2017/0221875 A1* | 8/2017 | Chen | H01L 27/0255 |
| 2017/0229446 A1* | 8/2017 | Fukasaku | H01L 27/0285 |
| 2018/0219532 A1* | 8/2018 | Tsyrganovich | H03K 17/687 |
| 2018/0358352 A1* | 12/2018 | Voldman | H01L 29/1025 |

\* cited by examiner

APPARATUS AND METHOD TO PREVENT INTEGRATED CIRCUIT FROM ENTERING LATCH-UP MODE

TECHNICAL FIELD

Embodiments of the disclosure relate generally to integrated circuits (ICs). More specifically, the disclosure relates to an apparatus to prevent an IC structure from entering a latch-up mode.

BACKGROUND

Devices with integrated circuits (ICs) have increased in complexity and functionality, those devices have required ever more dynamic ICs to meet the demands of those device users. IC design rules may be concerned with avoiding situations where the IC will enter a latch-up mode. Latch-up mode refers to the sudden appearance of a short circuit across a low-impedance pathway between nearby elements of an integrated circuit. IC structures which include four alternatingly-doped regions of semiconductor material may pose a risk of the IC entering into a latch-up mode. For instance, set of N-P-N-P doped regions placed side by side will create a P-N-P junction and an N-P-N junction capable of propelling electrical current in a single direction across the variously-doped regions. An electrical spike or similar event may cause the device to enter latch-up mode in such circumstances, and the electrical short from circuit latch-up may remain intact until the device is powered down.

Conventional IC design rules have attempted to mitigate the risk of latch-up events by specifying a minimum separation distance between two similarly-doped semiconductors across an oppositely-doped semiconductor. These design rules play an increasingly important role in limiting the chip scaling as IC structures continue to increase in complexity and density. Related concerns such as separation distance between terminals, parasitic resistance of semiconductor regions, etc., have further constrained options for preventing the circuit from entering a latch-up mode.

SUMMARY

A first aspect of the present disclosure provides an apparatus for preventing an integrated circuit (IC) structure from entering a latch-up mode, the apparatus including: a p-type substrate; an n-well within the p-type substrate; an n-type region within the p-type substrate, the n-type region being distinct from the n-well; a p-type region within the n-well; a power supply electrically coupled to the p-type region within the n-well; and a directional diode electrically coupling the power supply to the n-well in parallel with the p-type region, wherein the directional diode biases a current flow from the power supply to the n-well, and wherein the directional diode contacts the n-well distal to the p-type region.

A second aspect of the present disclosure provides an apparatus for preventing an integrated circuit (IC) structure from entering a latch-up mode, the apparatus including: a p-type substrate; an n-well within the p-type substrate; an n-type region within the p-type substrate, the n-type region being distinct from the n-well, wherein the n-type region is electrically coupled to ground; a p-type region within the n-well; and a directional diode electrically coupling the p-type substrate to ground in parallel with the n-type region, wherein the directional diode biases a current flow from the p-type substrate to ground, and wherein the directional diode contacts the p-type substrate distal to the n-type region.

A third aspect of the present disclosure provides apparatus for preventing an integrated circuit (IC) structure from entering a latch-up mode, the apparatus including: a p-type substrate; an n-well within the p-type substrate; a first device formed over the p-type substrate, and a pair of n-type terminals within the p-type substrate; a second device formed over the n-well, and a pair of p-type terminals within the n-well; a first shallow trench isolation (STI) on the p-type substrate and the n-well, and between the first and second devices; a power supply electrically coupled to one of the pair of p-type terminals of the second device; a directional diode electrically coupling the power supply to the n-well in parallel with the one of the pair of p-type terminals of the second device, wherein the directional diode biases a current flow from the power supply to the n-well, and wherein the directional diode contacts the n-well distal to the second device; and a second shallow trench isolation (STI) over the n-well between the second transistor and the directional diode.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an apparatus for preventing an integrated circuit (IC) structure from entering a latch-up mode. Design schematics for various IC structures may require multiple adjacent regions of opposite polarity to be placed near each other on the same region of a semiconductor substrate. Transistors, as one example of a device, may rely on the presence of a "P-N junction" to operate. A P-N junction is a device structure in which p-type and n-type semiconductor regions are brought into contact with each other, thereby creating a potential barrier. The height of the barrier is determined by the voltage applied between the p-type and n-type regions. Two types of P-N junctions are possible. A homojunction is a junction between p-type and n-type regions formed in one semiconductor material. A heterojunction is a junction between p-type and n-type regions formed between two different semiconductor materials.

Forming two sets of opposite-polarity regions will create four alternatingly-doped regions, and hence a P-N-P-N junction. A P-N-P-N junction poses a latch-up mode risk, in which multiple junctions will continuously propel electric current across the junctions to ground. Eliminating latch-up mode typically requires a power cycle of the entire IC structure. Embodiments of the disclosure provide an apparatus including a directional diode electrically coupling a power supply or ground to a doped region of an IC structure in parallel with a P-N junction in the same region of the IC structure and another, oppositely-doped region of the IC structure.

Figure 1:
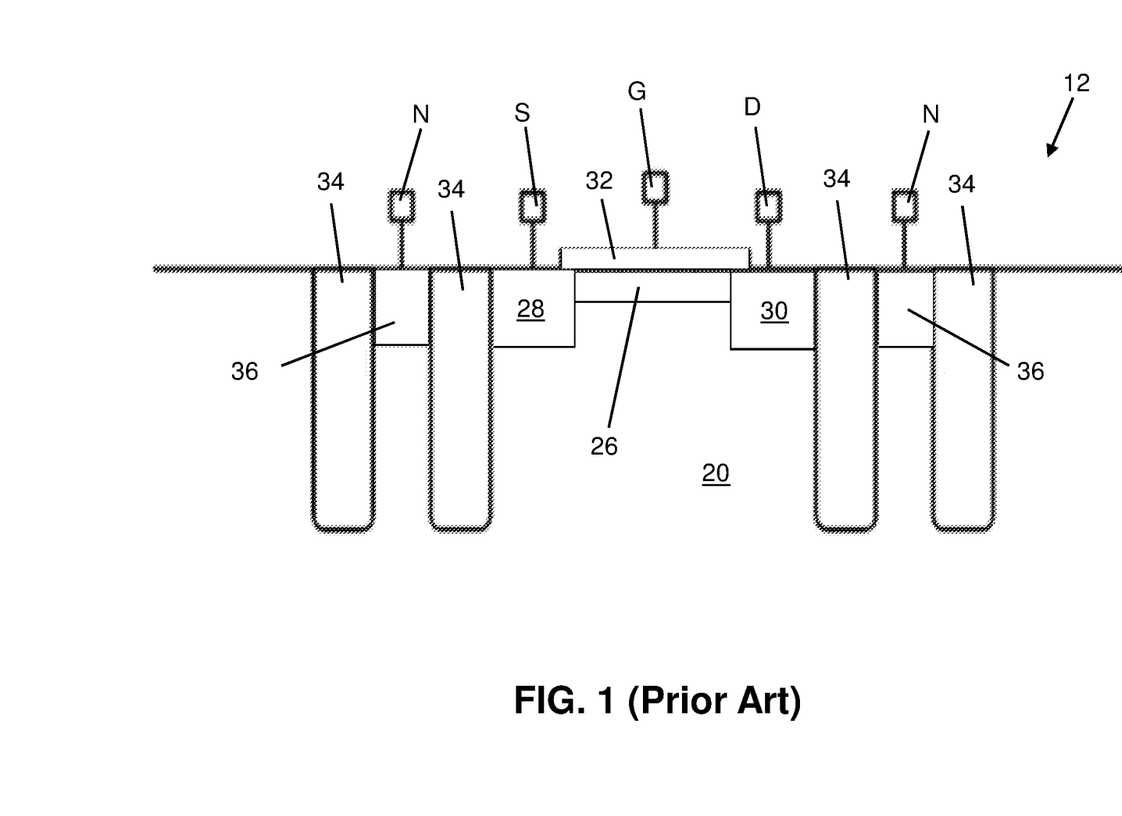
FIG. 1 shows a cross-sectional diagram of a conventional transistor structure.

Referring to FIG. 1, a conventional transistor 12 is depicted as a reference point for discussing apparatus features in embodiments of the present disclosure. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a channel region 26 may be positioned between a source region 28 and a drain region 30. A gate region 32 formed on channel region 26 can be coupled to a gate node G to control a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements.

Figure 2:
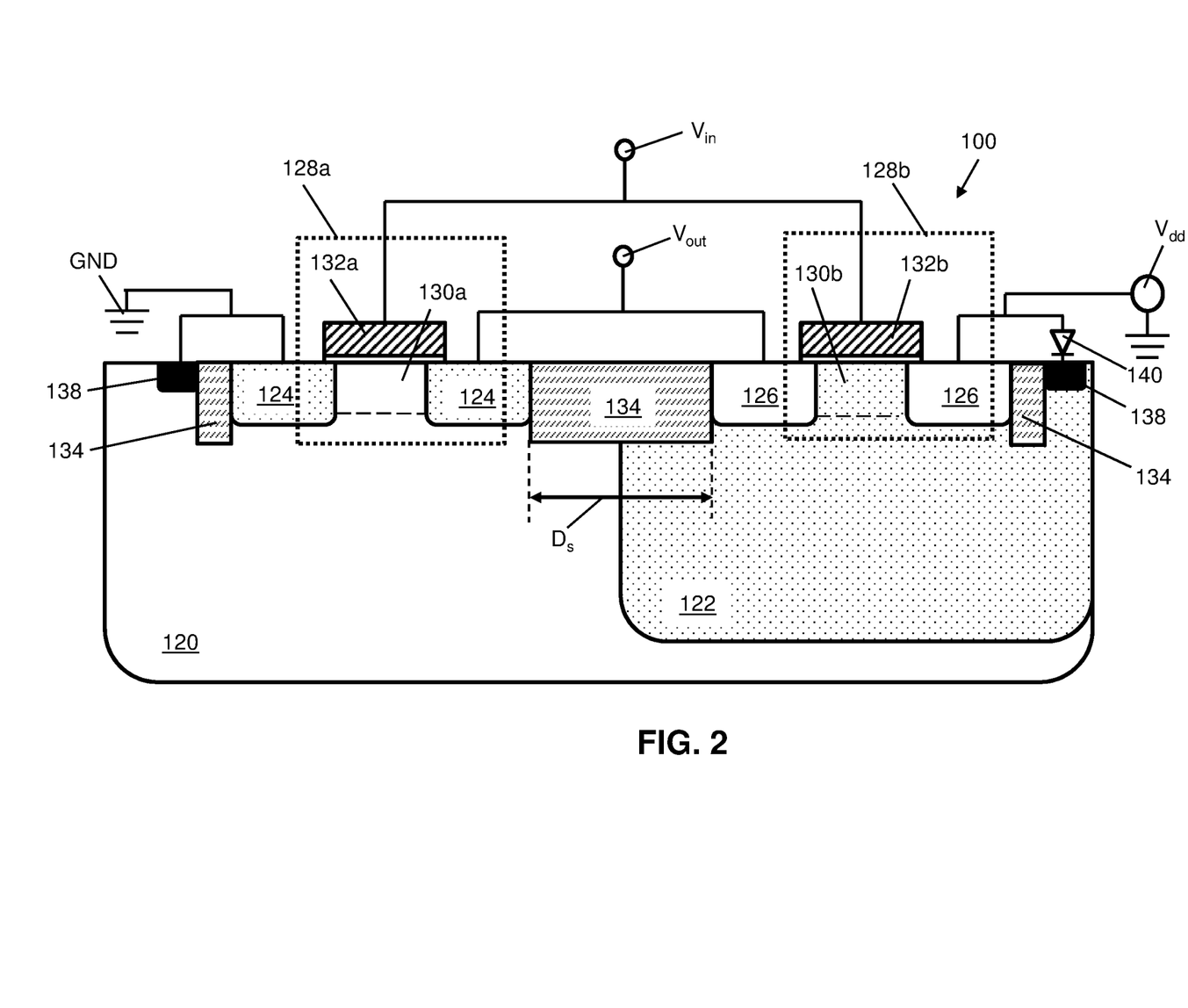
FIG. 2 shows a cross-sectional diagram of an apparatus according to embodiments of the disclosure.

FIG. 2 depicts an embodiment of an apparatus 100 for an IC structure from entering a latch-up mode. Apparatus 100 may be integrated into embodiments of conventional transistor 12 (FIG. 1) and/or substantially similar transistor architectures to prevent circuit components from entering latch-up mode. Apparatus 100 may include a p-type substrate 120 formed of one or more of the example semiconductor materials discussed above relative to substrate 20 (FIG. 1), in addition to one or more p-type dopants. P-type dopants refer to elements element introduced into semiconductor material to generate free hole by "accepting" electron from semiconductor atom and consequently "releasing" the hole. The acceptor atom must have one valence electron less than the host semiconductor. P-type dopants suitable for use in p-type substrate 120 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion.

Apparatus 100 may include an n-type doped well, simply "n-well" 122 hereafter, formed within p-type substrate 120. N-well 122 may be formed within p-type substrate 120 to a depth less than the total thickness of p-type substrate 120, but may have an upper surface coincident with the remainder of p-type substrate 120. N-well 122 may be formed by implanting n-type dopants into p-type substrate 120 and/or precursor semiconductor material by any currently known or later developed technique, e.g., ion implantation. N-type dopants are elements introduced into semiconductor materials to generate free electrons, e.g., by "donating" an electron to semiconductor. N-type dopants must have one more valance electron than the semiconductor. Common n-type donors in silicon (Si) include, e.g., phosphorous (P), arsenic (As), and/or antimony (Sb). Common donors in gallium arsenic (GaAs) include, e.g., sulphur (S), selenium (Se), tin (Sn), silicon (Si), and/or carbon (C).

N-well 122 being positioned within p-type substrate 120 causes a P-N junction to form between p-type substrate 120 and n-well 122. Other regions of doped semiconductor within p-type substrate 120 and n-well 122 will form a P-N-P-N junction, and thus may cause the device to be susceptible to entering latch-up mode. Specifically, apparatus 100 may include one or more n-type regions 124 within p-type substrate 120. N-type regions 124 may be formed by implanting opposite-polarity dopants into portions of p-type substrate 120. Although two n-type regions 124 are shown in FIG. 2 for the sake of example, this is not necessarily the case in all instances. In addition, apparatus 100 may include one or more p-type regions 126 within n-well 122. P-type region(s) 126 may be formed by implanting ions into targeted portions of n-well 122. Region(s) 124, 126 may form components of a larger device structure or set of device structures as noted herein. For the sake of example, p-type substrate 120, n-well 122, n-type region(s) 124, and p-type regions 126 are illustrated as being included in a two-device configuration, but embodiments of apparatus 100 may include any structure with a P-N-P-N configuration of alternating doped semiconductor regions.

As noted above, apparatus 100 in some cases may include sub-components of one or more devices. In one example, a first device 128a may be formed over p-type substrate 120. Similarly, a second device 128b may be formed over n-well 122. Each device 128a, 128b may include various other fundamental elements of an electronic device, e.g., a capacitor, diode, transistor, etc. In one non-limiting example, each device 128a, 128b may include the fundamental components of conventional transistor 12 (FIG. 1), and/or equivalent structural components. In this case, portions of p-type substrate 120 that are part of first device 128a may define a channel region 130a, and portions of n-well 122 that are part of second device 128b may form another channel region 130b. N-type region 124 may take the form of two n-type terminals within p-type substrate 122. P-type region 126 may take the form of a pair of p-type terminals within n-well 122. In the example of a transistor, first device 128a may include a gate 132a on p-type substrate 120 over channel region 130a. Second device 128b similarly may include a gate 132b on n-well 122 over channel region 130b. As shown, applying a voltage to gate 132a, 132b of each device 128a, 128b will induce a change in electrical potential within each channel region 130a, 130b. The induced change in electrical potential will selectively allow or inhibit current flow through channel regions 130a, 130b.

Apparatus 100 may include a set of shallow trench isolations (STIs) 134 to electrically insulate devices 128a, 128b of apparatus 100 from each other. An STI refers to a trench etched into semiconductor and filled with an insulating material such as oxide, to isolate one region of the substrate from an adjacent region of the substrate. One or more transistors of a given polarity may be disposed within an area isolated by STI. STIs 134 may be formed of, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. STIs 134 may physically and electrically separate n-type regions 124 from p-type regions 126. As shown, at least one STI may be positioned directly between one n-type region 124 and one p-type region 126. The separation distance $D_s$ between one n-type region 124 and one p-type region 126 may be, e.g., at least approximately fifty micrometers (μm). Thus, the physical distance between each device 128a, 128b may comply with design rules for physical separation between two opposite-polarity transistors on a single device.

Apparatus 100 may include a power supply $V_{dd}$ electrically coupled to one p-type region 126 of second device 128b. In the case of an inverter or similar circuit for amplifying or converting voltages, power supply $V_{dd}$ may provide the electrical potential for converting the polarity, magnitude, etc., of an input voltage to an output voltage with a predetermined gain. As shown, each gate 132a, 132b may be coupled in parallel to a signal input line $V_{in}$ and each region 124, 126 may be coupled in parallel to a signal output line $V_{out}$. The electrical couplings from input and output lines $V_{in}$, $V_{out}$ to various terminals of each device 128a, 128b may vary in some implementations, e.g., to provide a cross-coupled connection and/or other form of coupling. One n-type region 124 may be electrically coupled to ground GND, i.e., a zero-voltage, as shown.

Figure 3:
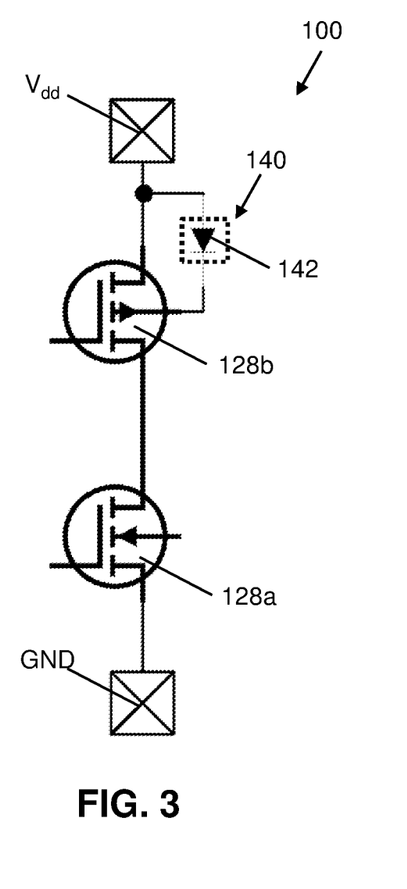
FIG. 3 shows a schematic diagram of an apparatus according to embodiments of the disclosure.

The adjacency of p-type region 126 to n-well 122, n-well 122 to p-type substrate 120, and p-type substrate 120 to n-type region 124, as shown in FIG. 2, may form a P-N-P-N electrical pathway from $V_{dd}$ to ground GND. FIG. 3 provides a schematic view of a possible electrical pathway in apparatus from $V_{dd}$ to ground GND through devices 128a, 128b in latch-up mode. The existence of a P-N-P-N pathway may render the circuit susceptible to current diffusion from $V_{dd}$ to ground GND through the alternatingly-doped regions. Although design rules for an IC structure may specify minimum amounts of separation between each of the doped regions, current diffusion may persist along this pathway. For example, increasing the separation distance between devices 128a, 128b may increase the amount of parasitic electrical resistance across the intermediate semiconductor regions, and thereby reduce the circuit's ability to offset and control electrical potential in n-well 122.

To provide greater resistance and current control across the P-N-P-N pathway, embodiments of the disclosure may include an electrically-biased connection to mitigate current diffusion. Apparatus 100 may include a contact 138 within n-well 122 (shown in FIG. 3) or p-type substrate 120 that is electrically coupled to a directional diode 140 from $V_{dd}$ or GND to the corresponding n-well 122 or p-type substrate 120. A directional diode is a two-terminal semiconductor device that exhibits a non-linear current-voltage characteristic during latch-up mode. The function of a diode is to allow current in one direction and to block current in the opposite direction. Contact 138 may include one or more conductive materials formed within n-well 122, e.g., one or more conductive metals and/or conductive silicide regions. Directional diode 140 may bias a current flow from power supply $V_{dd}$ to n-well 122. Directional diode 140 may provide an electrical connection that is parallel with the coupling from $V_{dd}$ to p-type region 126. To provide further electrical separation between the pathways from $V_{dd}$ to p-type region 126 and contact 138, an additional STI 134 may be formed within n-well 122 directly between p-type terminal and contact 138.

Referring specifically to FIG. 3, directional diode 140 may include any currently known or later developed electrical structure for biasing current flow in a single direction. In some cases, directional diode may take the form of a Schottky diode 142. Schottky diode 142 may be formed between contact 138 and n-well 122, e.g., by forming a metal-to-semiconductor junction within apparatus 100. In this case, contact 138 may be formed of metal and thus create the metal-to-semiconductor interface of a Schottky diode. The diode behavior of such a junction arises from a potential barrier along the interface between the semiconductor and metal. A "potential barrier" refers to heightened electrical potential at the junction between two materials featuring different work function; e.g. metal and doped semiconductor in the case of a Schottky diode. This effect causes an electric field to be present in the barrier region, and the size of the potential barrier depends on the semiconductor doping and an applied bias voltage. This phenomenon thus allows directional diode 140 to form along metal-to-semiconductor interfaces, e.g., between contact 138 and n-well 122.

Figure 4:
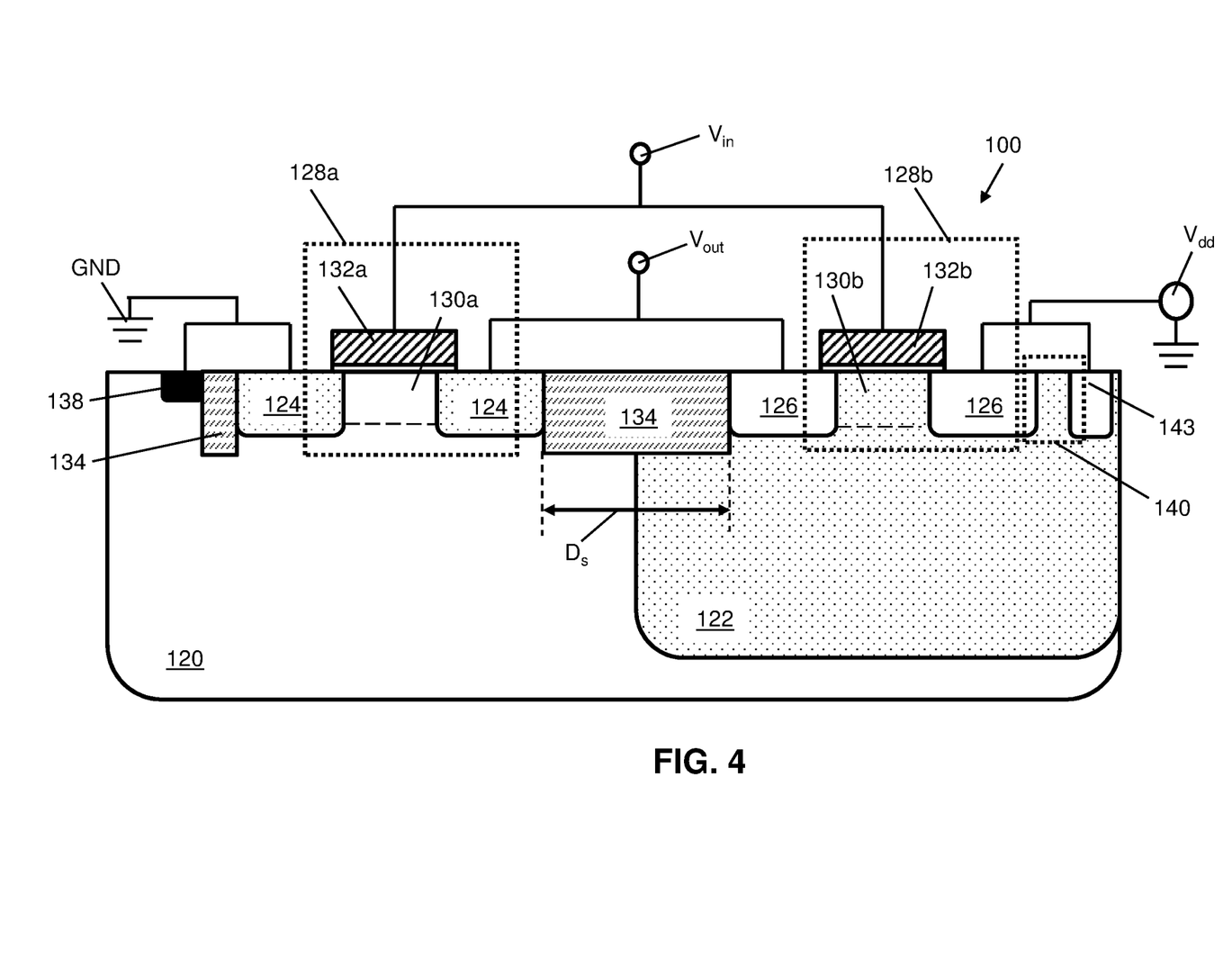
FIG. 4 shows a cross-sectional diagram of an apparatus according to another embodiment of the disclosure.

Referring briefly to FIG. 4, directional diode 140 of apparatus 100 may be formed by way of different electrical components. Specifically, a p-doped region 143 may be formed within n-well 122 at a location horizontally distal to second device 128b. Although p-type region 143 is shown in the same cross-sectional plane as second device 128b in FIG. 4, this is not necessarily the case in all implementations. For example, p-doped region 143 may be within n-well 122 at location forward or behind the plane of the page. A portion of n-well 122 may thus physically separate p-doped region 143 from p-type region(s) 126 of second device 128b. P-doped region additionally may be electrically coupled to power supply $V_{dd}$ in parallel with the connection between second device 128b and $V_{dd}$. The electrical connection to p-doped region 143, and the additional doped region within n-well 122, may form a directional diode 140 along the physical interface between n-well 122 and regions 126, 143. The physical interface of this embodiment thus may bias current flow from p-type region 143 to p-type region(s) 126 of second device 128b. During operation, this configuration may operate identically to the embodiment of apparatus 100 shown in FIG. 2, and discussed elsewhere herein.

Figure 5:
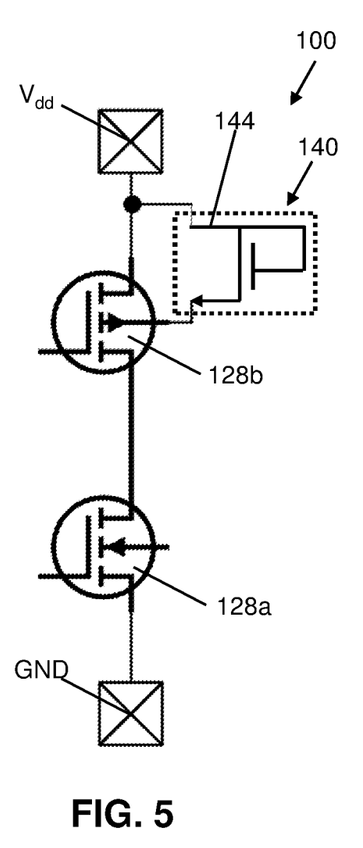
FIG. 5 shows a schematic diagram of an apparatus according to further embodiments of the disclosure.

Referring now to FIG. 5, various other electrical components may be used to form directional diode 140 between power supply $V_{dd}$ and n-well 122. In electrical circuit design, it is possible to form a diode by electrically coupling a transistor between two interconnected elements. According to one example, directional diode 140 may include a diode-connected transistor 144, i.e., a transistor having an interconnected gate and drain terminal. Diode-connected transistor 144 may feature less current leakage as compared to conventional diode structures, and/or Schottky diode 142 (FIG. 3). Diode-connected transistor 144 may electrically bias current flow from $V_{dd}$ to n-well 122, as shown in the schematic of FIG. 5. Regardless of whether directional diode 140 is provided via Schottky diode 142 or diode-connected transistor 144, the biased current flow through directional diode 140 will mitigate the risk of current flow through the latch-up pathway shown from $V_{dd}$ to ground GND.

Figure 6:
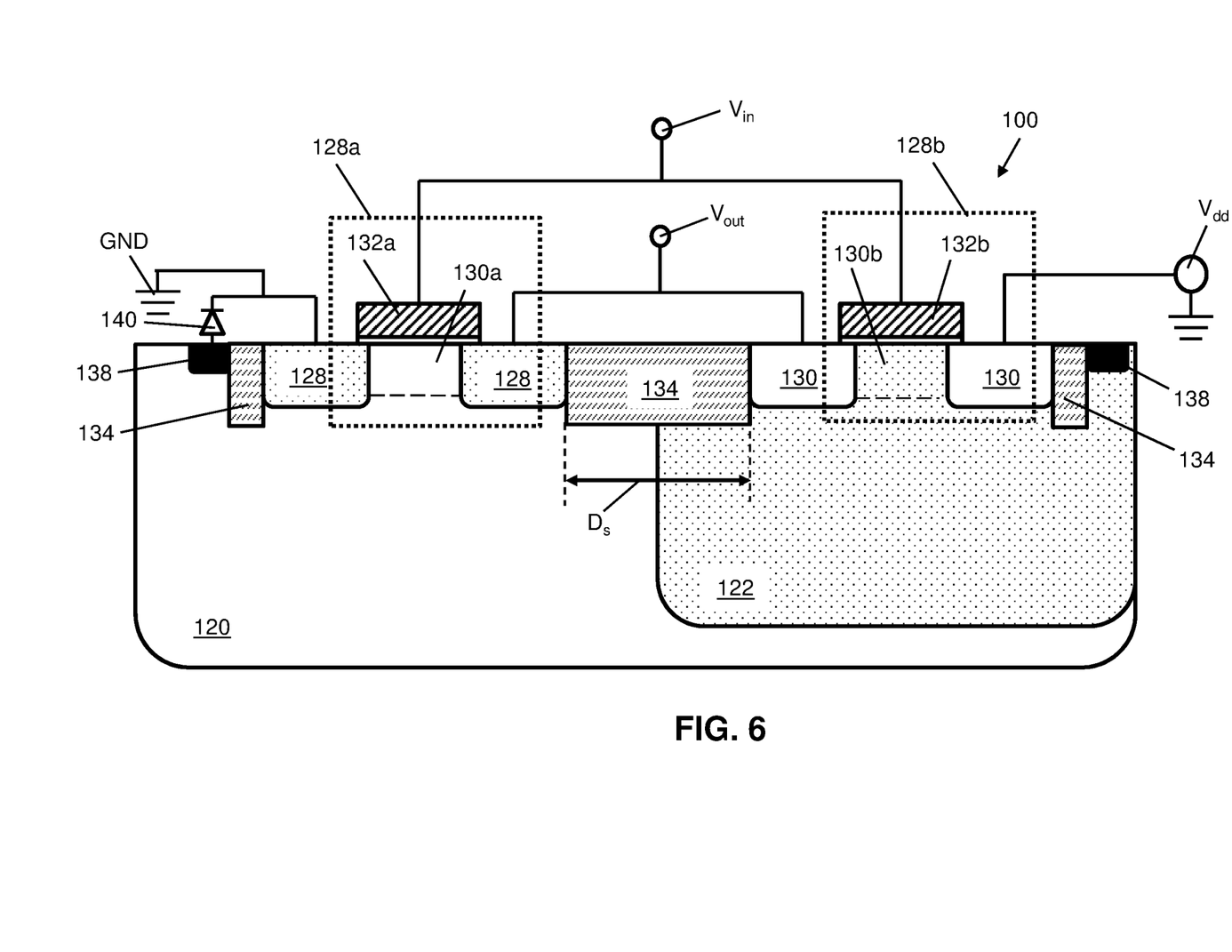
FIG. 6 shows a cross-sectional diagram of an apparatus according to additional embodiments of the disclosure.

Turning to FIG. 6, further embodiments of apparatus 100 may bias current flow between different portions of the latch-up pathway from $V_{dd}$ to ground GND. Directional diode 140 may electrically couple p-type substrate 120 to ground GND in parallel with the connection between one n-type region 124 and ground GND. In this case, directional diode 140 biases current flow from p-type substrate to ground GND at a location distal to, i.e., horizontally separated from, first device 128a. Directional diode 140 may be coupled to p-type substrate 120 through contact 138 to bias a current flow from p-type substrate 120 to ground GND. Here, directional diode 140 biases current flow from p-type substrate 120 to ground GND, in contrast to biasing current flow from power supply $V_{dd}$ to n-well 122. Power supply $V_{dd}$ may be electrically coupled to p-type region 126 without a parallel connection to n-well 122. In all other respects, apparatus 100 may include the same components, connections, etc., shown in FIG. 2 and discussed elsewhere herein. Additionally, the physical interface between semiconductor material in p-type substrate 120 and contact 138 may form a Schottky diode junction. Directional diode 140 thus biases bias current flow from p-type substrate 120 to ground GND.

Figure 7:
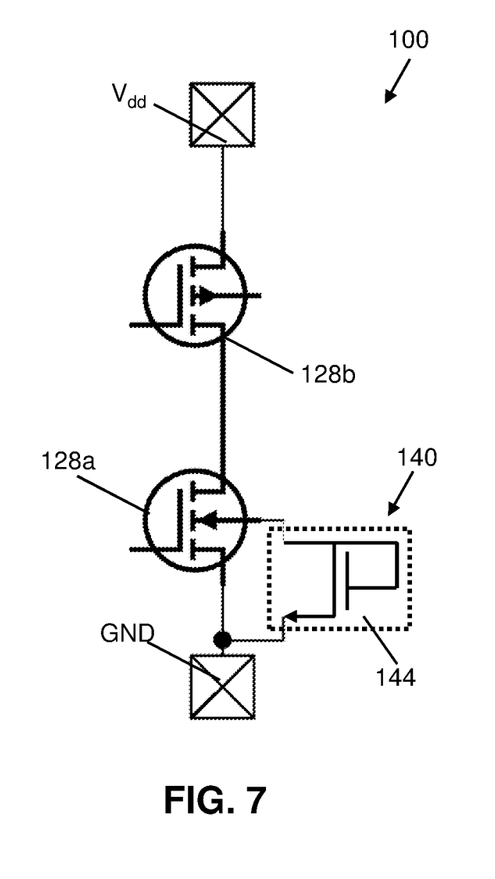
FIG. 7 shows a schematic diagram of an according to additional embodiments of the disclosure.

Referring to FIGS. 6 and 7, directional diode 140 of apparatus 100 may include any of the various current-biasing elements discussed elsewhere herein regardless of where it is located. For instance, FIG. 7 provides a schematic diagram of apparatus 100 in which directional diode 140 is provided as a diode-connected transistor 144. In this case, the source terminal of diode-connected transistor 144 is coupled to p-type substrate 120, and the drain and gate terminals of diode-connected transistor 144 are coupled to ground GND in parallel with the coupling between first region 124 and ground GND. It is also understood that directional diode 140 may be embodied as Schottky diode 142 (FIG. 3), or that the metal-to-semiconductor junction between contact 138 and p-type substrate 120 may form a Schottky diode 142.

Figure 8:
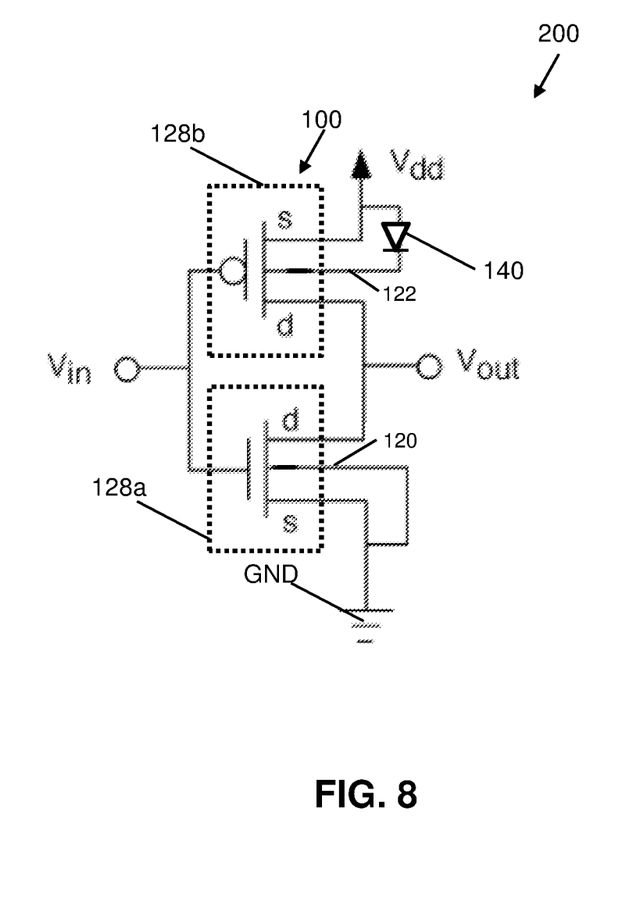
FIG. 8 provides a schematic diagram of an inverter circuit including an apparatus according to embodiments of the disclosure.

Turning to FIG. 8, embodiments of apparatus 100 for preventing latch-up mode may be incorporated into various circuit architectures to provide operational stability and compliance with various IC design parameters. According to one example, an inverter circuit 200 may include apparatus 100 to prevent the circuit from entering latch-up mode. An inverter refers to an electronic element for converting a voltage at an input node to an opposite-polarity voltage at an output node. As shown, inverter circuit 200 may include first and second devices 128a, 128b each coupled at their gate terminal to input voltage node $V_{in}$, and each coupled at their drain terminal (labeled "d") to output voltage node $V_{out}$. The source terminal (labeled "s") of first device 128a may be coupled to power supply $V_{dd}$, and the source terminal of second device 128b may be coupled to ground GND. It is understood that power supply $V_{dd}$ and ground GND may be coupled to the source terminal of opposite devices 128a, 128b in further embodiments of inverter circuit 200.

Directional diode 140 of apparatus 100 may electrically couple power supply $V_{dd}$ of inverter circuit 200 to n-well 122 of second device 128b. In further embodiments, directional diode 140 may bias current flow to ground GND. As shown, inverter circuit 200 may operate in the same manner as a conventional inverter by reversing voltage polarity from input terminal $V_{in}$ to output terminal $V_{out}$, while preventing latch-up mode via directional diode 140 between power supply $V_{dd}$ and n-well 122.

Figure 9:
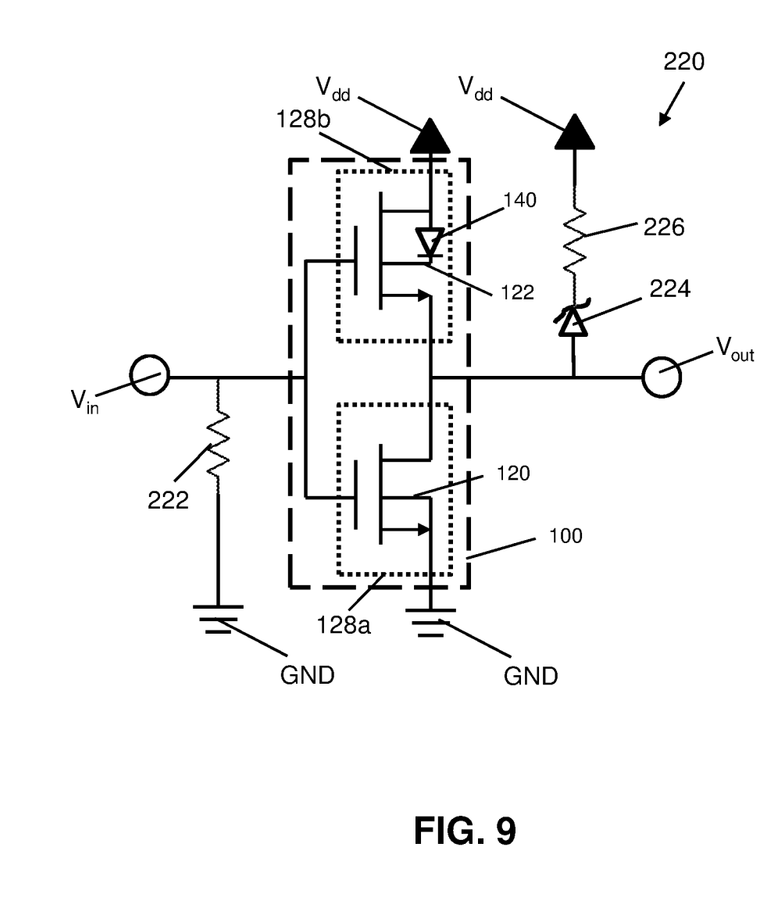
FIG. 9 provides a schematic diagram of a driver circuit including an apparatus according to embodiments of the disclosure.

Referring now to FIG. 9, embodiments of apparatus 100 may be included in a driver circuit 220. An example of driver circuit 220 is shown as an inverter driver, e.g., a circuit for electrically powering a light emitting diode (LED) display or similar component. In this case, driver circuit 220 may rely on apparatus 100 to convert an input voltage $V_{in}$ to an opposite polarity voltage $V_{out}$. Driver circuit 220 may include a reference resistor 222 connected between input voltage $V_{in}$ and ground GND. Reference resistor 222 prevents driver circuit 220 from accepting various electrical inputs (e.g., static charges), other than input voltage input voltage $V_{in}$.

As shown, driver circuit 220 may include power supply input voltage $V_{dd}$ connected to second device 128b of apparatus 100 and one terminal of a diode indicator 224 through a current-limiting resistor 226. The other terminal of diode indicator may be coupled to output voltage $V_{out}$ of apparatus 100, as shown. During operation, apparatus 100 may invert input voltage $V_{in}$ to provide an output voltage $V_{out}$ suitable to activate diode indicator 224. Diode indicator 224 may be a light-emitting diode configured to emit light when subjected to an electrical potential across its terminals. To provide device stability, current-limiting resistor 226 may be configured to limit the total current passing through diode indicator 226 during operation. Embodiments of apparatus 100 include directional diode 140 within second transistor 124 (or, alternatively, in first device 128a) to prevent latch-up mode via the pathway from power supply $V_{dd}$ to ground GND.

It is understood that apparatus 100 may be electrically integrated into any conceivable device configuration where a P-N-P-N structure appears. Although apparatus 100 is suitable for inverter and driver circuits as noted above, it is understood that apparatus 100, including directional diode 140, may be included in various other devices to prevent the circuit from entering latch-up mode while maintaining compliance with spacing rules for transistor components. Among other advantages, embodiments of apparatus 100 renders external latch-up ground rules moot due to directional diode 140 biasing current voltage away from possible latch-up pathways between a power supply and ground. Additionally, some internal latch-up design rules may be relaxed because directional diode 140 will prevent the circuit from entering a latch-up mode. These advantages may help to increase circuit density without imposing substantial demands on wafer manufacturing processes. These advantages are particularly significant despite the small amount of silicon area needed to form directional diode 140, and the addition of back-gage bias into doped substrate materials of a device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for preventing an integrated circuit (IC) structure from entering a latch-up mode, the apparatus comprising:
   a p-type substrate;
   an n-well within the p-type substrate;
   an n-type region within the p-type substrate, the n-type region being distinct from the n-well;
   a p-type region within the n-well, wherein the n-well is free of n-type regions therein;
   a power supply electrically coupled to the p-type region within the n-well; and
   a directional diode directly electrically coupling the power supply to a metal contact within the n-well in parallel with the p-type region, wherein the directional diode biases a current flow from the power supply to the n-well, and wherein the directional diode contacts the n-well distal to the p-type region.

2. The apparatus of claim 1, wherein a horizontal separation between the n-type region and the p-type region is at least fifty micrometers (μm).

3. The apparatus of claim 1, further comprising a shallow trench isolation (STI) over the n-well between the p-type region and the directional diode.

4. The apparatus of claim 1, wherein the n-type region within the p-type substrate includes a first n-type terminal electrically coupled to ground, and a second n-type terminal electrically coupled to the p-type region within the n-well.

5. The apparatus of claim 1, wherein the n-type region comprises a pair of n-type terminals of a first device, and wherein the p-type region comprises a pair of p-type terminals of a second device distinct from the first device.

6. The apparatus of claim 1, wherein the directional diode comprises a diode-connected transistor or a Schottky diode.

7. The apparatus of claim 1, wherein the n-type region and the p-type region are each electrically coupled to an inverter circuit or a driver circuit.

8. An apparatus for preventing an integrated circuit (IC) structure from entering a latch-up mode, the apparatus comprising:
   a p-type substrate;
   an n-well within the p-type substrate;
   an n-type region within the p-type substrate, the n-type region being distinct from the n-well, wherein the n-type region is electrically coupled to ground;
   a p-type region within the n-well, wherein the n-well is free of n-type regions therein; and
   a directional diode directly electrically coupling a metal contact within the p-type substrate to ground in parallel with the n-type region, wherein the directional diode biases a current flow from the p-type substrate to ground, and wherein the directional diode contacts the p-type substrate distal to the n-type region.

9. The apparatus of claim 8, wherein a horizontal separation between the n-type region the p-type region is at least fifty micrometers (μm).

10. The apparatus of claim 8, further comprising a shallow trench isolation (STI) over the p-type substrate between the n-type region and the directional diode.

11. The apparatus of claim 8, wherein the p-type region substrate includes a first p-type terminal electrically coupled to a power supply, and a second n-type terminal electrically coupled to the n-type region within the p-type substrate.

12. The apparatus of claim 10, wherein the n-type region comprises a pair of n-type terminals of a first device, and wherein the p-type region comprises a pair of p-type terminals of a second device distinct from the first device.

13. The apparatus of claim 8, wherein the directional diode comprises a diode-connected transistor or a Schottky diode.

14. The apparatus of claim 8, wherein the n-type region and the p-type region are each electrically coupled to an inverter circuit or a driver circuit.

15. An apparatus for preventing an integrated circuit (IC) structure from entering a latch-up mode, the apparatus comprising:
   a p-type substrate;
   an n-well within the p-type substrate;
   a first device formed over the p-type substrate, and a pair of n-type terminals within the p-type substrate, wherein the p-type substrate is free of p-type regions therein;
   a second device formed over the n-well, and a pair of p-type terminals within the n-well, wherein the n-well is free of n-type regions therein;
   a first shallow trench isolation (STI) on the p-type substrate and the n-well, and between the first and second devices;
   a power supply electrically coupled to one of the pair of p-type terminals of the second device;
   a directional diode electrically directly coupling the power supply to a metal contact within the n-well in parallel with the one of the pair of p-type terminals of the second device, wherein the directional diode biases a current flow from the power supply to the n-well, and wherein the directional diode contacts the n-well distal to the second device; and
   a second shallow trench isolation (STI) over the n-well between the second transistor and the directional diode.

16. The apparatus of claim 15, wherein a horizontal width of the first STI is at least fifty micrometers (μm).

17. The apparatus of claim 15, wherein one of the pair of n-type terminals of the first device is electrically coupled to ground.

18. The apparatus of claim 17, further comprising:
   a signal input line coupled to the first device in parallel with the gate of the second device; and
   a signal output line coupled to one of the pair of n-type terminals of the first device in parallel with one of the pair of p-type terminals of the second device.

19. The apparatus of claim 15, wherein the directional diode comprises a diode-connected transistor or a Schottky diode.

20. The apparatus of claim 15, wherein the first device and the second device are each electrically coupled to an inverter circuit or a driver circuit.

* * * * *